United States Patent
Ramdani

(10) Patent No.: US 11,114,539 B2
(45) Date of Patent: Sep. 7, 2021

(54) GATE STACK FOR HETEROSTRUCTURE DEVICE

(71) Applicant: Power Integrations, Inc., San Jose, CA (US)

(72) Inventor: Jamal Ramdani, Lambertville, NJ (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 16/158,560

(22) Filed: Oct. 12, 2018

(65) Prior Publication Data

US 2019/0115443 A1 Apr. 18, 2019

Related U.S. Application Data

(60) Provisional application No. 62/571,642, filed on Oct. 12, 2017.

(51) Int. Cl.
*H01L 29/778* (2006.01)
*H01L 29/51* (2006.01)
(Continued)

(52) U.S. Cl.
CPC ...... *H01L 29/513* (2013.01); *H01L 21/02167* (2013.01); *H01L 21/02178* (2013.01);
(Continued)

(58) Field of Classification Search
CPC ............. H01L 29/778; H01L 29/66462; H01L 29/513; H01L 29/518; H01L 29/66318;
(Continued)

(56) References Cited

U.S. PATENT DOCUMENTS

| 7,253,015 B2 | 8/2007 | Pophristic et al. |
| 7,547,928 B2 | 6/2009 | Germain et al. |

(Continued)

FOREIGN PATENT DOCUMENTS

| CN | 100594591 C | 3/2010 |
| CN | 101459080 B | 4/2010 |

(Continued)

OTHER PUBLICATIONS

European Search Report, Application No. 18199806.3-1212, dated Mar. 18, 2019, 13 pages.

(Continued)

*Primary Examiner* — Matthew C Landau
*Assistant Examiner* — Eric K Ashbahian
(74) *Attorney, Agent, or Firm* — Power Integrations, Inc.

(57) ABSTRACT

A heterostructure semiconductor device includes a first active layer and a second active layer disposed on the first active layer. A two-dimensional electron gas layer is formed between the first and second active layers. A sandwich gate dielectric layer structure is disposed on the second active layer. A passivation layer is disposed over the sandwich gate dielectric layer structure. A gate extends through the passivation layer to the sandwich gate dielectric layer structure. First and second ohmic contacts electrically connected to the second active layer. The first and second ohmic contacts are laterally spaced-apart, with the gate being disposed between the first and second ohmic contacts.

17 Claims, 3 Drawing Sheets

(51) Int. Cl.
*H01L 29/20* (2006.01)
*H01L 29/205* (2006.01)
*H01L 29/40* (2006.01)
*H01L 29/423* (2006.01)
*H01L 29/66* (2006.01)
*H01L 21/28* (2006.01)
*H01L 21/02* (2006.01)

(52) U.S. Cl.
CPC .. *H01L 21/02271* (2013.01); *H01L 21/28264* (2013.01); *H01L 29/2003* (2013.01); *H01L 29/205* (2013.01); *H01L 29/402* (2013.01); *H01L 29/42364* (2013.01); *H01L 29/517* (2013.01); *H01L 29/518* (2013.01); *H01L 29/66462* (2013.01); *H01L 29/7786* (2013.01); *H01L 29/7787* (2013.01)

(58) Field of Classification Search
CPC ........... H01L 29/66431; H01L 23/3171; H01L 21/28264; H01L 21/28587
See application file for complete search history.

(56) References Cited

U.S. PATENT DOCUMENTS

| | | |
|---|---|---|
| 7,939,853 B2 | 5/2011 | Murphy et al. |
| 8,183,597 B2 | 5/2012 | Ikeda et al. |
| 8,399,911 B2 | 3/2013 | Derluyn et al. |
| 8,569,124 B2 | 10/2013 | Akiyama et al. |
| 8,928,037 B2 | 1/2015 | Ramdani et al. |
| 9,722,064 B2 | 8/2017 | Cheng |
| 9,991,360 B2 | 6/2018 | Shealy et al. |
| 2002/0197835 A1 | 12/2002 | Sun et al. |
| 2005/0151255 A1 | 7/2005 | Ando et al. |
| 2006/0081948 A1 | 4/2006 | Lim et al. |
| 2006/0108606 A1 | 5/2006 | Saxler et al. |
| 2006/0197107 A1 | 9/2006 | Kanamura et al. |
| 2009/0026556 A1 | 1/2009 | Otake |
| 2009/0058532 A1 | 3/2009 | Kikkawa et al. |
| 2010/0012977 A1 | 1/2010 | Derluyn et al. |
| 2010/0025730 A1 | 2/2010 | Heikman et al. |
| 2010/0140663 A1* | 6/2010 | Hopper ............. H01L 29/42316 257/194 |
| 2010/0327322 A1 | 12/2010 | Kub et al. |
| 2010/0330754 A1 | 12/2010 | Hebert |
| 2011/0121313 A1 | 5/2011 | Briere |
| 2011/0227090 A1 | 9/2011 | Briere |
| 2012/0112263 A1 | 5/2012 | Tanaka et al. |
| 2012/0187451 A1 | 7/2012 | Saito |
| 2012/0205663 A1 | 8/2012 | Nakamura et al. |
| 2012/0235209 A1 | 9/2012 | Briere et al. |
| 2012/0319169 A1 | 12/2012 | Van Hove |
| 2013/0099284 A1 | 4/2013 | Tserng et al. |
| 2013/0256747 A1* | 10/2013 | Sin ........................ H01L 29/408 257/142 |
| 2014/0077266 A1* | 3/2014 | Ramdani ............. H01L 29/7786 257/194 |
| 2014/0124789 A1* | 5/2014 | Ramdani ........... H01L 21/28264 257/76 |
| 2015/0145004 A1* | 5/2015 | Inoue .................. H01L 29/4236 257/192 |
| 2015/0295076 A1 | 10/2015 | Van Hove |
| 2017/0358670 A1* | 12/2017 | Kub .................. H01L 21/02378 |
| 2018/0090313 A1* | 3/2018 | Chung .............. H01L 21/02274 |

FOREIGN PATENT DOCUMENTS

| | | |
|---|---|---|
| CN | 103681835 A | 7/2019 |
| CN | 103134476 A | 1/2020 |
| EP | 2600404 A2 | 6/2013 |
| EP | 2709157 A2 | 3/2014 |
| JP | 2003243323 A | 8/2003 |
| JP | 2004087587 A | 3/2004 |
| JP | 2009302435 A | 12/2009 |
| JP | 2009-302435 A | 4/2021 |
| WO | 03032397 A2 | 4/2003 |
| WO | 2008027027 A2 | 3/2008 |

OTHER PUBLICATIONS

Arulkumaran, Subramaniam, "Studies on the Influences of i-GaN, n-GaN, p-Gan and InGaN Cap Layers in AlGaN/GaN High-Electron-Mobility Transistors", Japanese Journal of Applied Physics, vol. 44, No. 5A, 2005, pp. 2953-2960.

Chowdhury, Srabanti, et al., "Lateral and Vertical Transistors Using the AlGaN/GaN Heterostructure", IEEE Transactions on Electron Devices, vol. 60, No. 10, Oct. 2013, pp. 3060-3066.

Maeda et al., "DC and RF Characteristics in Al2O3/Si3N4 Insulated-Gate AlGaN/GaN Heterostructure Field-Effect Transistors," Japanese Journal of Applied Physics, vol. 44, No. 21, 2005, pp. L646-L648, 3 pages.

Maeda et al., "Design of Insulator/AlGaN Structures in MIS AlGaN/GaN HFETs for Higher Device Performance," Gallium Nitride Materials and Devices IV, Proc of SPIE, vol. 7216, 721605 1-12, 2009, DOI 10.1117/12.808816.

Nguyen, Hong Hanh et al., "Charge Storage Characteristics of Si-rich Silicon Nitride and the Effect of Tunneling Thickness on Nonvolatile Memory Performance", Solid State Phenomena vols. 181-182, 2012, pp. 307-311.

Roccaforte, Fabrizio, et al., "An Overview of Normally-Off GaN-Based High Electron Mobility Transistors," MDPI Materials 2019, May 15, 2019, 18 pages.

Tamotsu, Hashizume, et al., "Chemistry and Electrical Properties of Surfaces of GaN and GaN/AlGaN Heterostructures," Journal of Vacuum Science & Technology: Part B, AVS/AIP, Melville, New York, NY, US. vol. 19, No. 4, Jul. 1/Aug. 2001, pp. 1675-1681, XP012008931.

Van Hove, Marleen, et al., "CMOS Process-Compatible High-Power Low-Leakage AlGaN/GaN MISHEMT on Silicon," IEEE Electron Device Letters, vol. 33, No. 5, May 2012, pp. 667-669, 3 pages.

Visalli, Domenica, "Optimization of GaN-on-Si HEMTs for High Voltage Applications," Katholieke Universiteit Leuven, Celestijnenlaan 200d-bus 2417 3001 Leuven Belgie, Dec. 2011, pp. 4-5/80/82.

Mishra et al.; "GaN-Based RF Power Devices and Amplifiers"; Proceedings of the IEEE; vol. 96 No. 2; Feb. 2008; p. 287-305.

Timp et al.; "The relentless march of the MOSFET gate oxide thickness to zero"; Microelectronics Reliability 40 (2000); pp. 557-563.

Chinese Patent Application No. 201711242043.0; "First Office Action, Search Report, and Machine Translation;" Jun. 3, 2021; 13 pages.

European Patent Application No. 18199806.3; "Communication Pursuant to Article 94(3) EPC"; Jul. 5, 2021; 6 pages.

* cited by examiner

GATE STACK FOR HETEROSTRUCTURE DEVICE

CROSS-REFERENCE TO RELATED APPLICATION

This application claims priority to U.S. Provisional Application No. 62/571,642 filed on Oct. 12, 2017, the contents of which are incorporated herein by reference.

BACKGROUND INFORMATION

Field of the Disclosure

The present invention relates generally to high-voltage field effect transistors (FETs); more specifically, to high-electron-mobility transistors (HEMTs) and heterostructure field-effect transistors (HFETs), and to methods of fabricating such power transistor devices.

Background

One type of high-voltage FET is a heterostructure FET (HFET), also referred to as a high-electron mobility transistor (HEMT). HFETs based on gallium nitride (GaN) and other wide bandgap nitride III based direct transitional semiconductor materials, such as silicon carbide (SiC), are utilized in certain electronic devices due to their physical properties. For example, GaN and AlGaN/GaN transistors are commonly used in high-speed switching and high-power applications (e.g., power switches and power converters) due to the high electron mobility, high breakdown voltage, and high saturation electron velocity characteristics offered by GaN-based materials and device structures. Due to the HFETs physical properties, HFETs may change states substantially faster than other semiconductor switches that conduct the same currents at the same voltages and the wide bandgap may improve performance of the HFET at elevated temperatures.

GaN-based HFETs devices typically include a gate member formed over a thin gate dielectric (e.g., oxide) material. In the past, interface states between the gate oxide and underlying GaN layers have played a role in the stability and electrical reliability of GaN-based HFETs. Improving the gate stability may achieve higher voltage operations (e.g., 600 V). Typical HFET gate structures include Schottky gates, which have no gate oxide, or a single, thin gate oxide layer. These structures suffer from low critical voltage usually in the range of 20-40 V. The critical voltage, VCRIT, is defined as the gate-to-source voltage, VGS, at which there is a relatively sharp rise in the gate leakage current.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
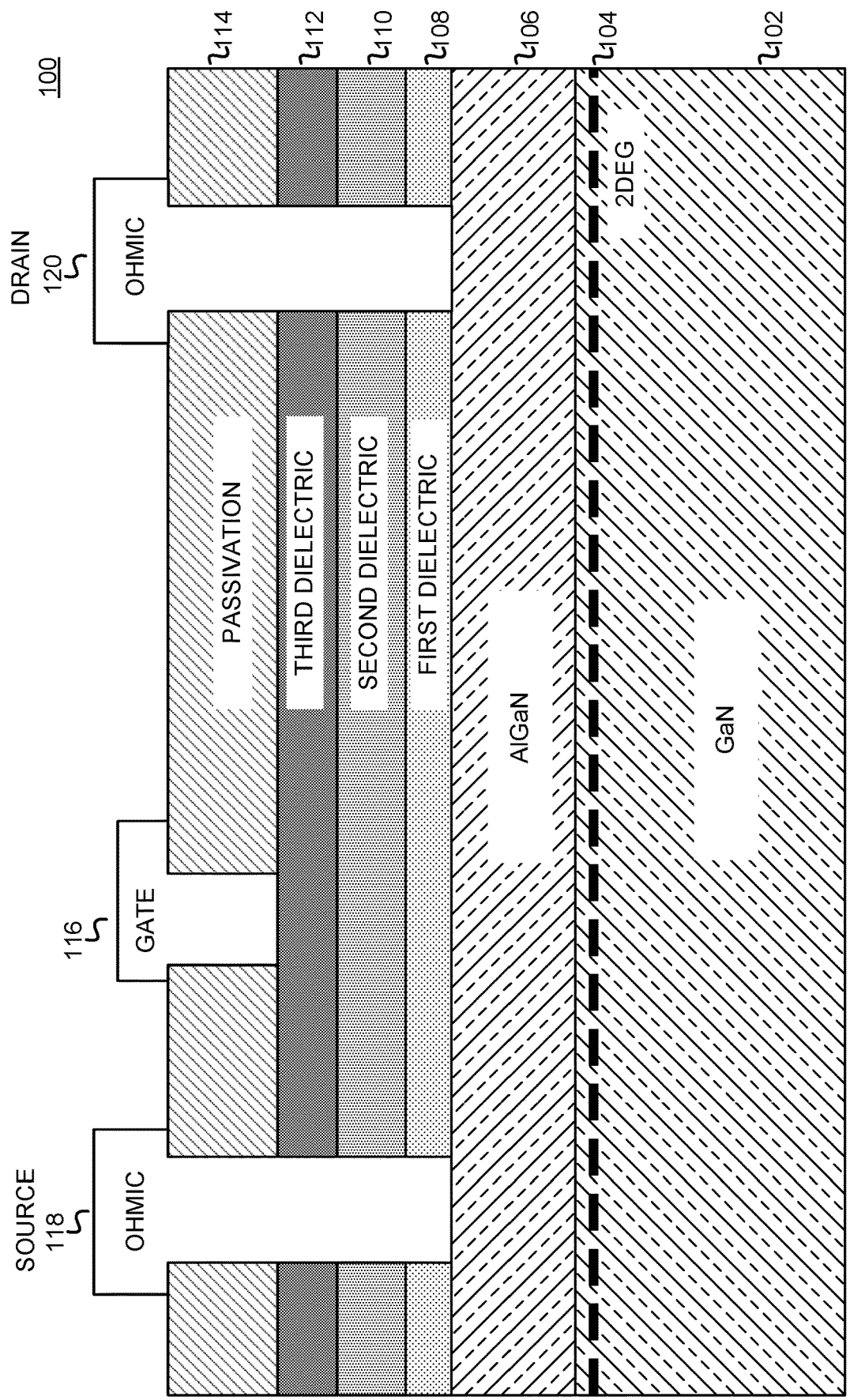
FIG. 1 is a cross-sectional side view of an example semiconductor device having a sandwich gate dielectric structure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a heterostructure transistor with multiple gate dielectric layers are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, the "critical voltage" or "critical gate voltage" of a HFET device is defined as the gate-to-source voltage at which there is a relatively sharp rise in the gate leakage current. Thermal stability relates to how much the gate leakage current of the device increases with temperature.

As mentioned above, typical HFET gate structures include Schottky gates, which have no gate oxide, or a single, thin gate oxide layer. These structures suffer from low critical voltage usually in the range of 20-40 V. The critical voltage, VCRIT, is defined as the gate-to-source voltage, VGS, at which there is a relatively sharp rise in the gate leakage current. To achieve higher reliability and high gate oxide integrity, the critical voltage needs to be increased from the present range of 20-40 V. Further, devices with a single, thin gate oxide layer may experience an increase in gate leakage current two or three times larger than the leakage current at room temperature when the device is operating at high temperatures (such as 120 degrees Celsius).

Properties of the gate dielectric also affect other parameters and characteristics of the HFET. For example, the thickness of the gate dielectric layer plus the thickness of the underlying barrier layer partially determine the gate threshold voltage of a high-voltage HFET. Whereas a thicker gate dielectric reduces gate leakage current with increased temperature or increased applied gate voltage, the thickness of the gate dielectric contributes to the threshold voltage. As such, a trade-off exists between thermal and voltage stability versus the ability to provide a constant threshold voltage for the HFET device.

In accordance with embodiments of the present invention, a GaN-based HFET device and method of fabricating the same is disclosed which includes a sandwich gate dielectric structure. In one embodiment, the HFET device has first and second active layers with a two-dimensional electron gas layer forming there between. A sandwich gate dielectric structure is disposed on the second active layer and includes a first, second, and third gate dielectric layer. A first gate dielectric layer is disposed on the second active layer. Nitride-based compounds such as silicon nitride (SiN), carbon nitride (CN), boron nitride (BN), or aluminum nitride (AlN) may be utilized for first gate dielectric layer. A second gate dielectric layer is disposed on the first gate dielectric layer and SiN, CN, BN, or AlN may be used for the second gate dielectric layer. A third gate dielectric layer is disposed on the second gate dielectric layer. In one example, aluminum oxide (Al2O3) may be used for the third gate dielectric layer. A gate is disposed on the third gate dielectric layer and extends to the top of the sandwich gate dielectric structure. Ohmic contacts (source and drain) of the device extend through the sandwich gate dielectric structure to contact the second active layer.

In various embodiments this sandwich gate dielectric structure may result in high critical voltage operation (e.g., >80 V). Further, a device utilizing a sandwich gate dielectric structure may experience improved thermal stability. The device may experience substantially no change in the leakage current when the device is operating at temperatures upwards to 200 degrees Celsius. In addition to producing a more stable and robust gate dielectric structure, other benefits may also include lower gate leakage and a more uniform gate threshold voltage. The sandwich gate dielectric structure may also allow the HFET device to maintain a constant threshold voltage while minimizing gate leakage current.

In the descriptions below, an example HFET is used for the purpose of explanation. However, it should be appreciated that embodiments of the present invention may be utilized with other types of FETs, such as a metal oxide semiconductor FET (MOSFET) or metal insulator semiconductor FET (MISFET) devices.

FIG. 1 illustrates a cross-sectional side view of a semiconductor device 100 (e.g., a GaN HFET) which includes a first active layer 102, a second active layer 106, a first gate dielectric 108, a second gate dielectric 110, a third gate dielectric 112, a passivation layer 114, ohmic contacts 118 and 120, and gate 116. Further shown in FIG. 1 is a layer of electrical charge 104 which may form between the first active layer 102 and the second active layer 106 due to the bandgap difference between the two layers. The layer of electrical charge 106 defines the lateral conductive channel which is sometimes called a two-dimensional electron gas (2DEG) layer 106 because electrons trapped in a quantum well that results from the bandgap difference between the first and second active layer 102 and 106 are free to move in two dimensions but are tightly confined in the third dimension. Further, the first active layer 102 is sometimes called a channel layer or buffer layer while the second active layer 106 is sometimes called the barrier layer or donor layer.

The second active layer 106 is disposed on first active layer 102. The sandwich gate dielectric structure 113 is disposed on the second active layer and includes the first gate dielectric layer 108, second gate dielectric layer 110 and the third gate dielectric layer 112. First gate dielectric layer 108 is disposed on second active layer 106. The second gate dielectric layer 110 is disposed on first gate dielectric layer 108. A third gate dielectric layer 112 is disposed on the second gate dielectric layer 110. A passivation layer 114 is disposed on the sandwich gate 113 dielectric structure. As shown, the passivation layer 114 is disposed on the third gate dielectric layer 112. A gate 116 extends vertically down through passivation layer 114 to the third gate dielectric layer 112. Respective source and drain ohmic contacts 118 & 120 are shown extending vertically down through passivation layer 114, third gate dielectric layer 112, second gate dielectric layer 110, and first gate dielectric layer 108 to electrically connect to second active layer 106. In other words, the ohmic contacts 118 and 120 extend to the bottom of the sandwich gate dielectric structure 113. As shown, source and drain ohmic contacts 118 & 120 are laterally spaced-apart, with gate 116 being disposed between source and drain ohmic contacts 118 & 120.

It is appreciated that first active layer 102 is typically disposed over a substrate (not shown) formed of any one of a number of different materials, such as sapphire ($Al_2O_3$), silicon (Si), GaN, or silicon carbide (SiC). In one embodiment, first active layer 102 comprises an epitaxial GaN layer. To avoid possible problems with lattice mismatch and/or differences in thermal coefficients of expansion, one or more additional layers may be disposed between the substrate and first active layer 102. For example, an optional thin nucleation layer may be formed between the substrate and first active layer 102. In other examples, first active layer 102 may comprise different semiconductor materials containing nitride compounds of other Group III elements. The first active layer 102 may be grown or deposited on the substrate.

In the example of FIG. 1 second active layer 106 comprises aluminum gallium nitride (AlGaN). In other examples, different Group III nitride semiconductor materials such as aluminum indium nitride (AlInN) and aluminum indium gallium nitride (AlInGaN) may be used for second active layer 106. In other embodiments, the material of second active layer 106 may be a non-stoichiometric compound. In such materials, the ratios of the elements are not easily represented by ordinary whole numbers. For example, the second active layer 106 may be a non-stoichiometric compound of a Group III nitride semiconductor material such as $Al_XGa_{1-X}N$, where 0<X<1. The second active layer 106 may be grown or deposited on the first active layer 102.

In one embodiment, first gate dielectric layer 108 comprises silicon nitride (SiN). In other embodiments, first gate dielectric layer 108 may comprise Si3N4. In still other examples, different nitride-based compounds such as carbon nitride (CN), boron nitride (BN), or aluminum nitride (AlN) may be utilized for first gate dielectric layer 108. The first gate dielectric layer 108 may be a nitride based material which may conserve the atomic arrangement with the second active layer 106. Further, the first gate dielectric layer 108 may be insulating and have a band gap of at least 3 electron volts (eV). In one example, the thickness of first gate dielectric layer 108 may be substantially between 1-5 nanometers (nm) thick. First gate dielectric layer 108 may be deposited in-situ with first and second active layers 102 and layer 106, respectively. First gate dielectric layer 108 may be deposited using metal-organic chemical vapor decomposition (MOCVD). In another embodiment, first gate dielectric layer 108 may be deposited ex-situ from first and second active layers 102 and 106 through atomic layer deposition (ALD).

As shown, second gate dielectric layer 110 is disposed on first gate dielectric layer 108. In one example, second gate dielectric layer 110 comprises silicon nitride (SiN). In other embodiments, second gate dielectric layer 110 may comprise Si3N4. Different nitride-based compounds such as carbon nitride (CN), boron nitride (BN), or aluminum nitride (AlN) may be utilized for the second gate dielectric layer 110. The second gate dielectric layer 110 has a thickness in the range of approximately 20-60 nm thick. In one embodiment, the second gate dielectric layer 110 is thicker than the first gate dielectric layer 108. Further, the material used for both the second gate dielectric layer 110 and the first gate dielectric layer 108 may be the same. The sum of the thicknesses of the first and second gate dielectric layer 108 and 110 may be in the range of 30-60 nm. The second gate dielectric layer 110 may be deposited in-situ with the first and second active layer 102 and 106 and the first gate dielectric layer 108 through processes such as MOCVD. In another example, the second gate dielectric layer 110 may be deposited ex-situ from the first and second active layer 102 and 106 and the first gate dielectric layer 108 through processes such as ALD.

The third gate dielectric layer 112 is disposed on the second gate dielectric layer 110. In one example, the third gate dielectric layer 112 comprises aluminum oxide (Al$_2$O$_3$). In further examples, other oxide materials such as ZrO, HfO, SiO2, and GdO may be used for the third gate dielectric layer 112. The third gate dielectric layer 112 has a thickness in the range of 10-20 nm. In one embodiment, the second gate dielectric layer 110 is thicker than the first gate dielectric layer 108 and the third gate dielectric layer 112. In one example, the third gate dielectric layer 112 is deposited ex-situ from the first and second active layers 102 and 106 using ALD.

The above mentioned gate dielectric structure may be referred to as a sandwich gate dielectric structure as the second gate dielectric layer 110 is sandwiched between the first gate dielectric layer 108 and the third gate dielectric layer 110. As will be described later, this type of sandwich structure may increase the overall stability of the device 100 and may greatly reduce the leakage current. In other examples, there may be multiple sandwiched layers between the first gate dielectric layer 108 and the third gate dielectric layer 112.

Passivation layer 114 is disposed on the third gate dielectric layer 112 and laterally surrounds ohmic contacts 118, 120, and gate 116. In one embodiment, passivation layer 114 may comprise a dielectric material such as silicon nitride (SiN). Passivation layer 114 may comprise multiple layers of material. Passivation layer 114 provides stability of the electrical characteristics of the device 100 by isolating the surface of the device from electrical and chemical contaminants of the environment. Passivation layer 114 may be deposited through chemical vapor deposition such as low pressure chemical vapor deposition (LPCVD) or plasma-enhanced chemical vapor deposition (PECVD).

The sandwich gate dielectric structure of the first, second, and third gate dielectric layers 108, 110, and 112, respectively, separate the gate 116 from second active layer 106. As shown, gate 116 is disposed through passivation layer 114 to contact the third gate dielectric layer 112. In one embodiment, gate 116 comprises a titanium/titanium nitride/aluminum copper stack. In another embodiment, gate 116 comprises a titanium gold (TiAu) alloy or molybdenum gold MoAu alloy. In other examples, gate 116 may comprise a gate electrode and gate field plate. In operation, the gate 116 controls the forward conduction path between ohmic source and drain contacts 118 and 120. In an example fabrication process, gate 116 may be formed by etching an opening in passivation layer 114, followed by a gate metal deposition. In the example of FIG. 1, the portion of gate 116 which is above passivation layer 114 and extends laterally towards ohmic drain contact 120 serves as a gate field plate, which functions to alleviate the electric field intensity at an edge (closest to ohmic contact 120).

Ohmic contacts 118 and 120 are disposed through passivation layer 114, third gate dielectric layer 112, second gate dielectric layer 110, and first gate dielectric layer 108 to contact the second active layer 106. Ohmic contact 118 is one example of a source contact, while ohmic contact 120 is one example of a drain contact. In one embodiment, ohmic contacts 118 and 120 may be formed by etching openings in passivation layer 114, the third gate dielectric layer 112, second gate dielectric layer 110, and first gate dielectric layer 108, followed by a metal deposition and annealing steps.

As shown, FIG. 1 illustrates the device structure at a point in the fabrication process just after formation of ohmic metal contacts 118 and 120, which respectively comprise source and drain electrodes of GaN HFET device 100. FIG. 1 shows ohmic metal contacts 118 and 120 formed directly on the second active layer 106. In other embodiments, ohmic metal contacts 118 and 113 may be formed in recesses which extend vertically downward into the second active layer 106. In other embodiments, ohmic metal contacts 118 and 120 may be formed in recesses that extend vertically downward through second active layer 106 to contact the first active layer 102.

When HFET device 100 is configured for use as a power switch, gate 116 and ohmic contacts 118 & 120 are typically coupled through terminals to form electrical connections to external circuits. In operation, electric charge in 2DEG layer 104 flows laterally between the ohmic contacts 118 and 120 to become a current in an external circuit. The electric charge flow, and hence the current, may be controlled by a voltage from an external circuit that is electrically connected between the gate 116 and ohmic contact 118.

As used in this disclosure, an electrical connection is an ohmic connection. An ohmic connection is one in which the relationship between the voltage and the current is substantially linear and symmetric for both directions of the current. For example, two metal patterns that contact each through only metal are electrically connected. In contrast, ohmic contacts 118 and 120 (as shown) are not electrically connected to each other in HFET device 100 because any connection between these two contacts is through a channel in the semiconductor material, which conduction path is controlled by gate 116. Similarly, gate 116 is not electrically connected to second active layer 106 since first, second, and third gate dielectric layers 108, 110, and 112 insulate gate 116 from the underlying active layers.

In the embodiments described above, the thicknesses of the first (108), second (110), and third (112) gate dielectric layers are such that the gate leakage current remains substantially constant over temperature during normal operation of HFET device 100. Stated differently, HFET device 100 may not experience any substantial change in gate leakage current when the device is operating at 120° C. In addition, various embodiments of the present invention may operate up to 200° C. without significant changes to the gate leakage current.

Furthermore, the sandwich gate dielectric layer structure described herein may improve the voltage stability of the HFET device. For example, the critical voltage of HFET device 100 is significantly increased to range of approximately 100-170 V.

Figure 2:
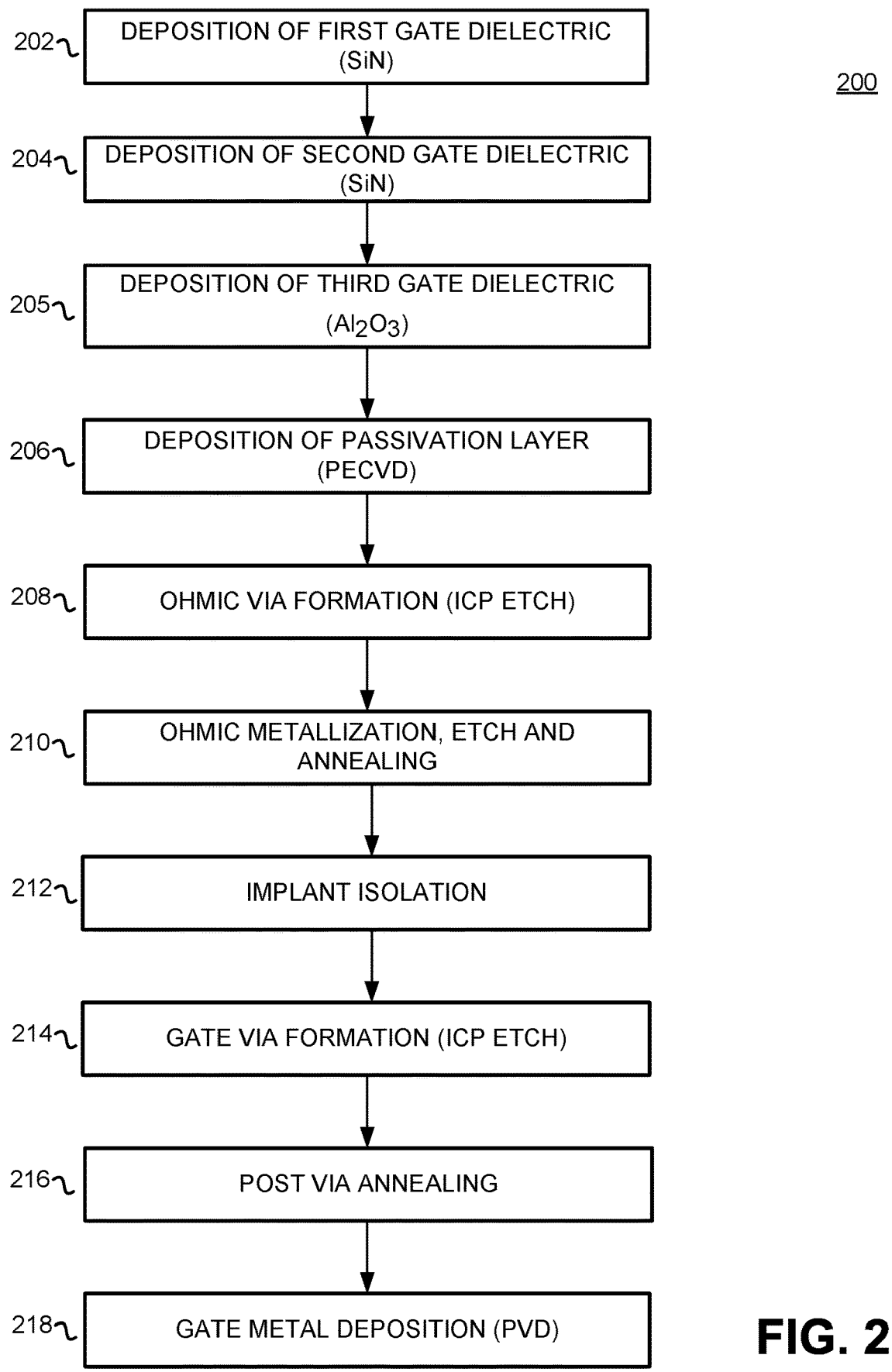
FIG. 2 is a diagram illustrating an example process flow for fabricating a semiconductor device having a sandwich gate dielectric structure.

FIG. 2 is a diagram 200 illustrating an example process flow for fabricating a semiconductor device such as HFET device 100 shown in FIG. 1. In the example shown, the process starts after both the first and second active layer layers have been deposited or grown on a substrate. To begin in block 202, a first gate dielectric layer is grown in-situ. In one embodiment, the first gate dielectric layer is deposited using a MOCVD technique carried out at a temperature range between 800-1050 OC. The first gate dielectric layer is formed to a thickness of approximately 1-5 nm, and is continuous over the surface of the wafer. In one embodiment, the thickness of the gate dielectric layer is about 4 nm. In another embodiment, the first gate dielectric layer is formed in-situ with the first and second active layers. For example, the same machine (MOCVD) that is used to form the first and second active layers may also be used to form the first gate dielectric layer. The first gate dielectric layer may comprise SiN. When depositing the SiN first gate dielectric layer, the Si source for the deposition may be silane or di-silane as a source of Si. In other embodiments the first gate dielectric layer may be deposited ex-situ from the first and second active layers.

Next, at block 204, the second gate dielectric layer is deposited atop the first gate dielectric layer. In one embodiment, the second gate dielectric layer is deposited in-situ with the first and second active layers and the first gate dielectric layers using MOCVD. The second gate dielectric layer is formed to a thickness of approximately 20-60 nm and is continuous over the surface of the wafer. The first gate dielectric layer may comprise SiN. When depositing the SiN first gate dielectric layer, the Si source for the deposition may be silane or di-silane as a source of Si. In another embodiment, the second gate dielectric layer may be deposited ex-situ from the first gate dielectric layer and may be deposited using plasma-enhanced atomic layer deposition (PEALD), inductive coupling plasma (ICP), chemical vapor deposition (CVD), or atomic layer deposition (ALD). When depositing the SiN second gate dielectric layer by ALD, the Si source for the deposition may be amino silane or organometallic source of Si.

At block 205, the third gate dielectric layer is deposited on the wafer surface ex-situ from the first gate dielectric layer, and the first and second active layers, at 300° C. using PEALD. In one embodiment, the third gate dielectric layer is deposited using ALD with an Al(CH3)3 precursor and O2 plasma. The third gate dielectric layer is formed to a thickness in a range of 10-20 nm.

The process continues to block 206 where a passivation layer is deposited over the third gate dielectric layer. In one embodiment, the passivation layer may be deposited using PECVD. The passivation layer is typically formed to a thickness in a range of approximately 100-150 nm. As discussed above, the passivation layer may comprise silicon nitride (SiN) or other materials having similar properties.

At block 208, the ohmic vias are formed. The ohmic source and drain contacts are formed through the passivation layer and the sandwich gate dielectric structure. In one example, the ohmic vias are formed using inductively coupled plasma (ICP) etching.

At block 210, ohmic metallization, etch and annealing are performed. Once the ohmic vias are formed through the afore-mentioned layers, a metal or metal alloy is deposited to fill the openings. In one example fabrication sequence, the metal utilized for the ohmic contacts are deposited using sputtering techniques or physical vapor deposition (PVD). An example ohmic contact metal may include layers of titanium (Ti), aluminum (Al), titanium (Ti) and titanium nitride (TiN). The metal ohmic contacts are then annealed utilizing a RTA tool at a temperature range of approximately 400-600° C. At block 212, implant isolation to isolate the device may be performed using nitrogen or argon implantation.

The gate may be formed in a similar manner as the ohmic contacts. At block 214, the gate via may be formed by etching an opening though passivation layer to expose the third gate dielectric layer. In one embodiment, ICP etching may be performed.

After the etching process exposes the third gate dielectric layer, the device undergoes high temperature annealing in block 216. By way of example, the annealing step may be performed in a furnace at temperature range of 450-650° C. for approximately 5-20 minutes. Annealing may also be performed using a number of different tools, such as a rapid temperature annealing (RTA) tool.

At block 218, a gate metal or metal alloy deposition is performed to fill the etched opening. Metal may be deposited using sputtering techniques or physical vapor deposition (PVD). An example gate metal may include layers of titanium (Ti), titanium nitride (TiN), aluminum copper (AlCu), and titanium nitride (TiN).

Persons of ordinary skill in the semiconductor arts will understand that other standard post-fabrication or back-end processing steps may be performed, including forming metal (e.g., patterned lines or traces) on the surface of the wafer, wafer backgrinding (also called backlapping or wafer thinning), die separation, and packaging.

Figure 3:
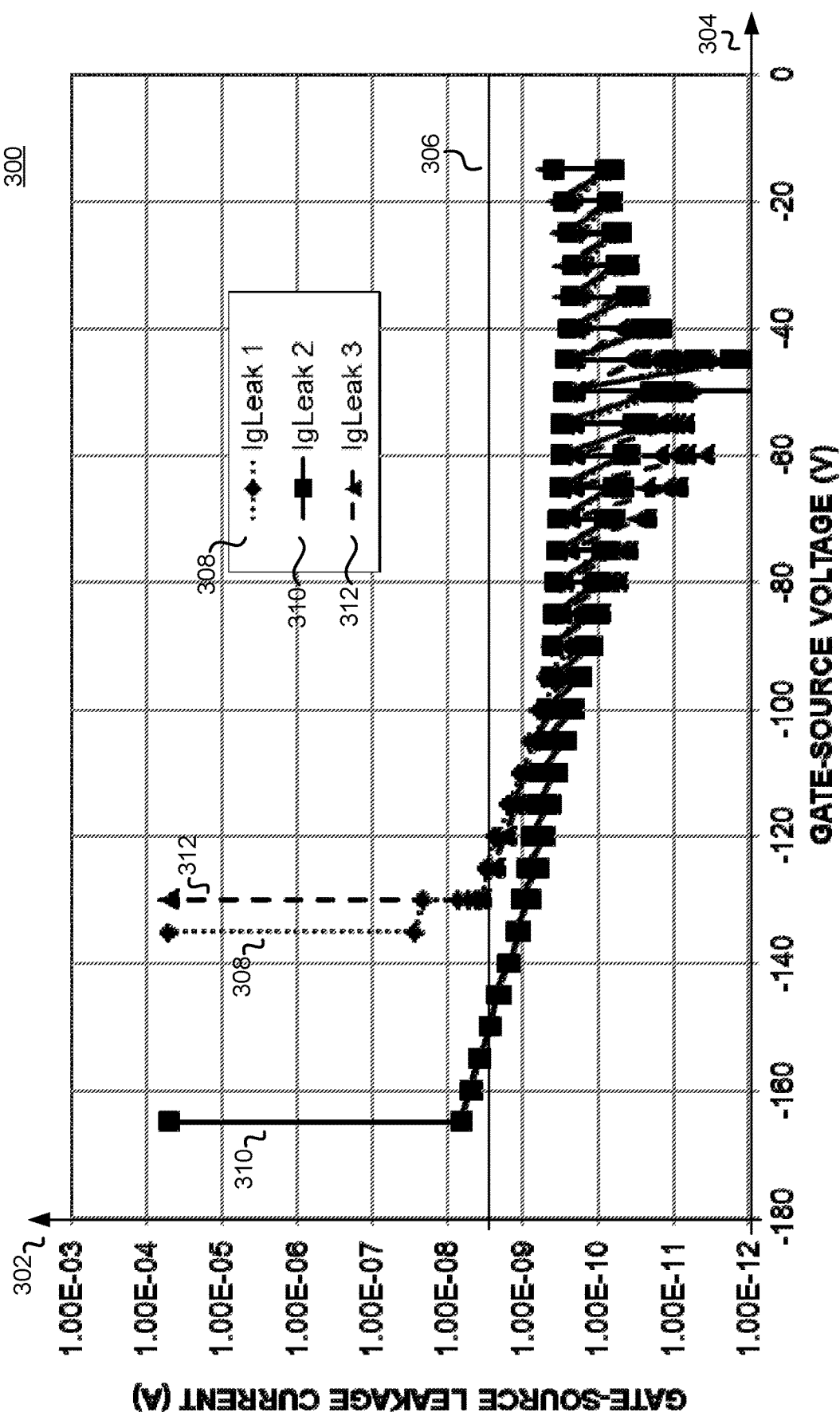
FIG. 3 is a graph illustrating example gate source leakage versus applied step stress of a sandwich gate dielectric structure.

FIG. 3 is a graph illustrating example gate source leakage current versus applied step stress voltage for various HFET devices each having a sandwich gate dielectric structure of FIG. 1. As shown, the x-axis represents absolute gate voltage 304 while the y-axis is the gate-source leakage current 302. Graph 300 further shows a critical threshold level 306. The critical threshold 306 may be defined as the threshold where the gate-source leakage current 302 is no longer acceptable and the device is considered in breakdown. For the example shown, the critical threshold 306 is substantially 5.00E-9 A or 5 nA. In addition, the critical voltage refers to the gate voltage at which the gate-source leakage current for the particular device reaches the critical threshold 306.

As shown, graph 300 illustrates the performance of a first device 308, a second device 310, and a third device 312. The gate voltage for each of the various devices is increased in steps while the gate-source leakage current 302 is measured. For the first device 308, the critical voltage is approximately −135V. For the second device 310, the critical voltage is approximately −165 V. For the third device 312, the critical voltage is approximately −130 V. All three devices, 308, 310, and 312 implement the sandwich gate dielectric structure with the first, second, and third gate dielectric layers. As shown in FIG. 3, the magnitude of the critical voltages for devices 308, 310, and 312 are larger than 100V. Devices which do not use the sandwich gate dielectric structure could have critical voltage magnitudes much less than 100V.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, thicknesses, material types, etc., are provided for explanation purposes and that other values may also be employed in other embodiments and examples in accordance with the teachings of the present invention.

What is claimed is:

1. A heterostructure semiconductor device comprising:
    a first active layer;
    a second active layer disposed on the first active layer, a two-dimensional electron gas layer formed between the first and second active layers;
    a sandwich gate dielectric layer structure disposed on the second active layer, wherein at least one layer of the sandwich gate dielectric layer structure is an ex-situ deposited layer formed through atomic layer deposition (ALD) with O2 plasma as compared to the first active layer and the second active layer and at least another layer of the sandwich gate dielectric layer structure is an in-situ deposited layer formed through metal-organic chemical vapor deposition (MOCVD) as compared to the first active layer and the second active layer, wherein the in-situ deposited layer has a thickness between 30-60 nanometers such that a critical voltage of the heterostructure semiconductor device is between approximately 100-170 volts;
    a passivation layer disposed over the sandwich gate dielectric layer structure;
    a gate that extends through the passivation layer to the top of the sandwich gate dielectric layer structure, wherein the gate is vertically separated from the second active layer by the sandwich gate dielectric layer structure and the sandwich gate dielectric layer structure is beneath a bottommost surface of the gate; and
    first and second ohmic contacts disposed on the second active layer, the first and second ohmic contacts being laterally spaced-apart, the gate being disposed between the first and second ohmic contacts, wherein the two-dimensional electron gas layer is formed between the first and second active layers beneath the first and second ohmic contacts and the gate, wherein the heterostructure semiconductor device is a high-voltage FET.

2. The heterostructure semiconductor device of claim 1 wherein the sandwich gate dielectric layer structure comprises:
    a first gate dielectric layer disposed on the second active layer;
    a second gate dielectric layer disposed on the first gate dielectric layer; and
    a third gate dielectric layer disposed on the second gate dielectric layer.

3. The heterostructure semiconductor device of claim 2 wherein the third gate dielectric layer comprises aluminum oxide (Al2O3).

4. The heterostructure semiconductor device of claim 2 wherein the first gate dielectric layer has a first thickness; the second gate dielectric layer has a second thickness, the third gate dielectric layer has a third thickness, and the second thickness is larger than the first thickness and the third thickness.

5. The heterostructure semiconductor device of claim 2 wherein the first gate dielectric layer comprises a nitride-based compound.

6. The heterostructure semiconductor device of claim 2 wherein the first gate dielectric layer comprises silicon nitride (SiN).

7. The heterostructure semiconductor device of claim 2 wherein the first gate dielectric layer comprises carbon nitride (CN).

8. The heterostructure semiconductor device of claim 2 wherein the first gate dielectric layer comprises boron nitride (BN).

9. The heterostructure semiconductor device of claim 2, wherein the first gate dielectric layer and the second gate dielectric layer comprise the same material.

10. The heterostructure semiconductor device of claim 2, wherein the first gate dielectric layer and the second gate dielectric are in-situ deposited layers with the first active layer and the second active layer formed through metal-organic chemical vapor deposition (MOCVD), and the third gate dielectric layer is an ex-situ deposited layer as compared to the first active layer and the second active layer.

11. The heterostructure semiconductor device of claim 2 wherein the first gate dielectric layer has a first thickness in a range of approximately 1-5 nanometers;
    the second gate dielectric layer has a second thickness in a range of approximately 20-60 nanometers; and the third gate dielectric has a third thickness in a range of 10-20 nanometers.

12. The heterostructure semiconductor device of claim 11 wherein the first, second, and third thicknesses are set such that a leakage current through the gate is substantially constant versus temperature during normal operation of the heterostructure semiconductor device.

13. The heterostructure semiconductor device of claim 11 wherein the first, second, and third thicknesses are set such that a threshold voltage is substantially constant versus temperature during normal operation of the heterostructure semiconductor device.

14. The heterostructure semiconductor device of claim 11 wherein a sum of the first thickness of the first gate dielectric layer and the second thickness of the second gate dielectric layer is approximately 30-60 nanometers.

15. The heterostructure semiconductor device according to claim 1 wherein the first active layer comprises gallium nitride (GaN) and the second active layer comprises aluminum gallium nitride (AlGaN).

16. The heterostructure semiconductor device of claim 1 wherein the gate includes a gate field plate that extends toward the second ohmic contact, wherein the second ohmic contact is a drain contact.

17. The heterostructure semiconductor device of claim 1 wherein the passivation layer comprises silicon nitride (SiN).

* * * * *